(12) United States Patent
Lai et al.

(10) Patent No.: US 11,480,869 B2
(45) Date of Patent: Oct. 25, 2022

(54) PHOTOMASK WITH ENHANCED CONTAMINATION CONTROL AND METHOD OF FORMING THE SAME

(71) Applicant: TAIWAN SEMICONDUCTOR MANUFACTURING COMPANY LTD., Hsinchu (TW)

(72) Inventors: Chien-Hung Lai, Taichung (TW); Hao-Ming Chang, Pingtung (TW); Chia-Shih Lin, Hsinchu (TW); Hsuan-Wen Wang, Kaohsiung (TW); Yu-Hsin Hsu, Taichung (TW); Chih-Tsung Shih, Hsinchu (TW); Yu-Hsun Wu, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/849,990

(22) Filed: Apr. 15, 2020

(65) Prior Publication Data

US 2021/0063869 A1   Mar. 4, 2021

Related U.S. Application Data

(60) Provisional application No. 62/893,728, filed on Aug. 29, 2019.

(51) Int. Cl.
*G03F 1/58* (2012.01)
*G03F 1/22* (2012.01)
(Continued)

(52) U.S. Cl.
CPC .......... *G03F 1/58* (2013.01); *G03F 1/22* (2013.01); *G03F 1/76* (2013.01); *G03F 1/80* (2013.01)

(58) Field of Classification Search
CPC ...... G03F 1/58; G03F 1/72; G03F 1/76; G03F 1/80; G03F 1/22; G03F 1/24
See application file for complete search history.

(56) References Cited

U.S. PATENT DOCUMENTS 6,013,399 A * 1/2000 Nguyen ............... B82Y 10/00
                                                      430/5
7,010,764 B2 * 3/2006 Pierrat ................. G06F 30/39
                                                      430/30

(Continued)

FOREIGN PATENT DOCUMENTS

JP   2010-206177   *   9/2010
JP   2012-049243   *   3/2012
(Continued)

OTHER PUBLICATIONS

Machine translation of JP 2014-168019 (2014).*
(Continued)

*Primary Examiner* — Martin J Angebranndt
(74) *Attorney, Agent, or Firm* — WPAT, P.C., Intellectual Property Attorneys; Anthony King

(57) ABSTRACT

A photomask includes a substrate, a multilayer stack disposed over the substrate and configured to reflect a radiation, a capping layer over the multilayer stack, and an anti-reflective layer over the capping layer. The anti-reflective layer comprises a first pattern, wherein the first pattern exposes the capping layer and is configured as a printable feature. The photomask also includes an absorber spaced apart from the printable feature from a top-view perspective.

20 Claims, 9 Drawing Sheets

(51) Int. Cl.
  *G03F 1/80* (2012.01)
  *G03F 1/76* (2012.01)

(56) References Cited

U.S. PATENT DOCUMENTS

| | | | |
|---|---|---|---|
| 10,915,015 B2 | 2/2021 | Kim et al. | |
| 2002/0142597 A1* | 10/2002 | Park | G03F 1/36 |
| | | | 438/689 |
| 2002/0192571 A1* | 12/2002 | Schwarzl | B82Y 40/00 |
| | | | 430/5 |
| 2003/0147058 A1* | 8/2003 | Murakami | G03F 1/48 |
| | | | 355/53 |
| 2006/0257753 A1* | 11/2006 | Kim | G21K 1/062 |
| | | | 430/5 |
| 2007/0128528 A1* | 6/2007 | Hess | G03F 1/30 |
| | | | 430/5 |
| 2010/0027106 A1* | 2/2010 | Weiser | G03F 1/72 |
| | | | 359/359 |
| 2011/0059391 A1* | 3/2011 | Shoki | B82Y 10/00 |
| | | | 430/5 |
| 2011/0173578 A1* | 7/2011 | Tsai | G03F 1/36 |
| | | | 716/55 |
| 2013/0010275 A1 | 1/2013 | Medvedev et al. | |
| 2014/0113222 A1* | 4/2014 | Lu | G03F 1/24 |
| | | | 430/5 |
| 2014/0189614 A1* | 7/2014 | Liu | G03F 1/70 |
| | | | 716/55 |
| 2015/0074620 A1* | 3/2015 | Zhao | G03F 1/38 |
| | | | 716/53 |
| 2016/0011501 A1 | 1/2016 | Huang et al. | |
| 2016/0266058 A1* | 9/2016 | Naka | G03F 1/86 |
| 2017/0263444 A1* | 9/2017 | Shoki | G03F 1/80 |
| 2018/0067390 A1* | 3/2018 | Kwon | G03F 1/52 |
| 2018/0341740 A1* | 11/2018 | Cecil | G03F 1/24 |
| 2019/0004416 A1* | 1/2019 | Wang | H01L 21/0276 |
| 2019/0056653 A1* | 2/2019 | Kawahara | G03F 1/38 |
| 2019/0074186 A1* | 3/2019 | Gallagher | H01L 21/3088 |
| 2020/0033736 A1* | 1/2020 | Bristol | G03F 7/70308 |
| 2020/0057363 A1* | 2/2020 | Hsu | G03F 1/54 |

FOREIGN PATENT DOCUMENTS

| | | | |
|---|---|---|---|
| JP | 2012-204708 | * | 10/2012 |
| JP | 2014-107332 | * | 6/2014 |
| JP | 2014-168019 | * | 9/2014 |
| JP | 2015-053433 | * | 3/2015 |
| KR | 2009-0051838 | * | 5/2009 |
| KR | 20160007331 A | | 1/2016 |
| KR | 20190075339 A | | 7/2019 |
| TW | 201214059 A | | 4/2012 |

OTHER PUBLICATIONS

Machine translation of JP 2012-204708 (2012).*
Machine translation of JP 2012-049243 (2012).*
Machine translation of JP 2014-107332 (2014).*
Machine translation of JP 2015-053433 (2015).*
Machine translation of KR 2009-0051838 (May 2009).*
H. Over, "Surface Chemistry of Ruthenium Dioxide in Heterogeneous Catalysis and Electrocatalysis: From Fundamental to Applied Research," Chem. Rev., vol. 112, pp. 3356-3426, 2012. Relevant part: p. 3377, Table 1 and Table 2.
Micheal M.Steeves, "Electronic transport properties of ruthenium and ruthenium dioxide thin films," PhD thesis, University of Maine, May 2011. Relevant part: p. 32, Fig. 1.1.
US20130010275 serves as the English translation for TW201214059A.
US20160011501A1 Corresponds to KR20160007331A.
U.S. Appl. No. 10/915,015 B2 Corresponds to KR20190075339A.

* cited by examiner

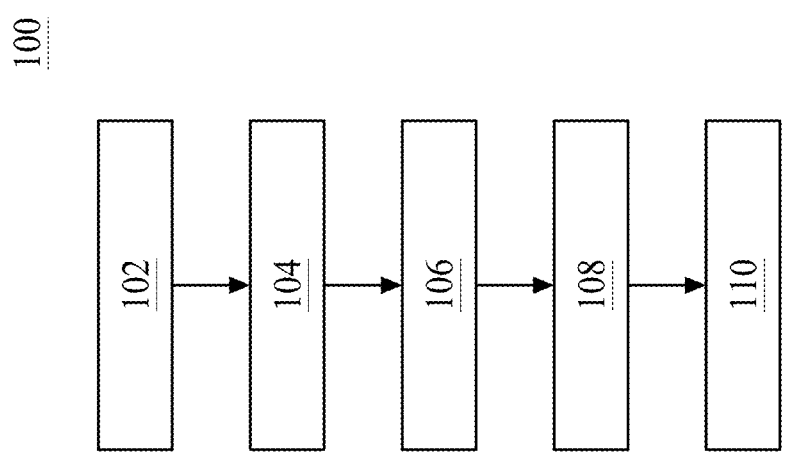

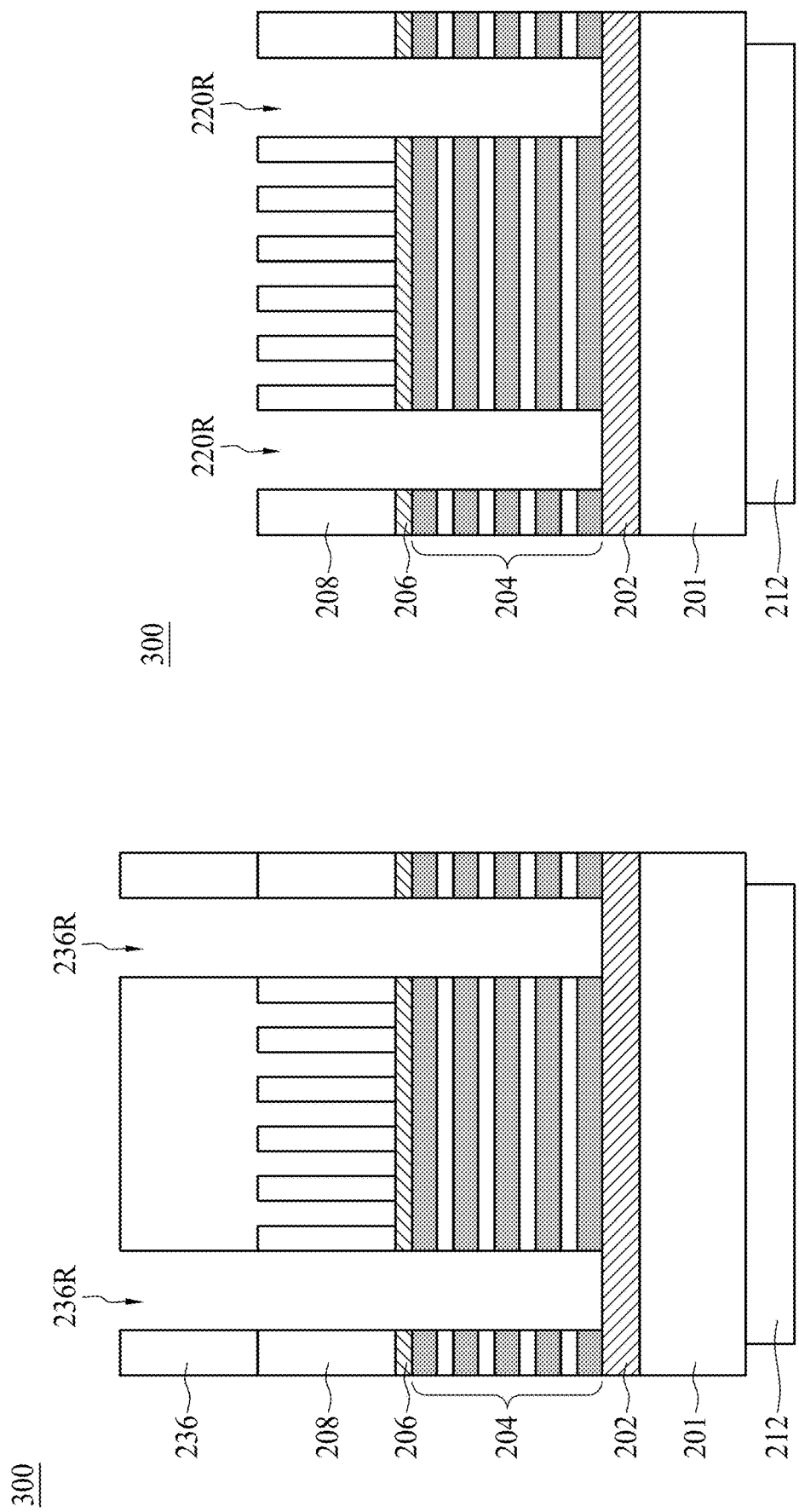

PHOTOMASK WITH ENHANCED CONTAMINATION CONTROL AND METHOD OF FORMING THE SAME

PRIORITY CLAIM AND CROSS-REFERENCE

This application claims priority to U.S. Provisional Application No. 62/893,728 filed Aug. 29, 2019, the disclosure of which is hereby incorporated by reference in its entirety.

BACKGROUND

In advanced semiconductor technologies, the continuing reduction in device size and increasingly complex circuit arrangements have made the design and fabrication of integrated circuits (ICs) more challenging and costly. To pursue better device performance with smaller footprint and less power, advanced lithography technologies, e.g., extreme ultraviolet (EUV) lithography, have been investigated as approaches to manufacturing semiconductor devices with a relatively small line width, e.g., 30 nm or less. EUV lithography employs a photomask to control the irradiation of a substrate under EUV radiation so as to form a pattern on the substrate.

While existing lithography techniques have improved, they still fail to meet requirements in many aspects. For example, contamination by foreign particles during the EUV lithography process continues to raise significant issues.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 is a block diagram of a lithography system, in accordance with some embodiments.

FIGS. 3A to 3F are cross-sectional views of intermediate stages of a method of manufacturing a photomask, in accordance with some embodiments.

DETAILED DESCRIPTION

Figure 2A:
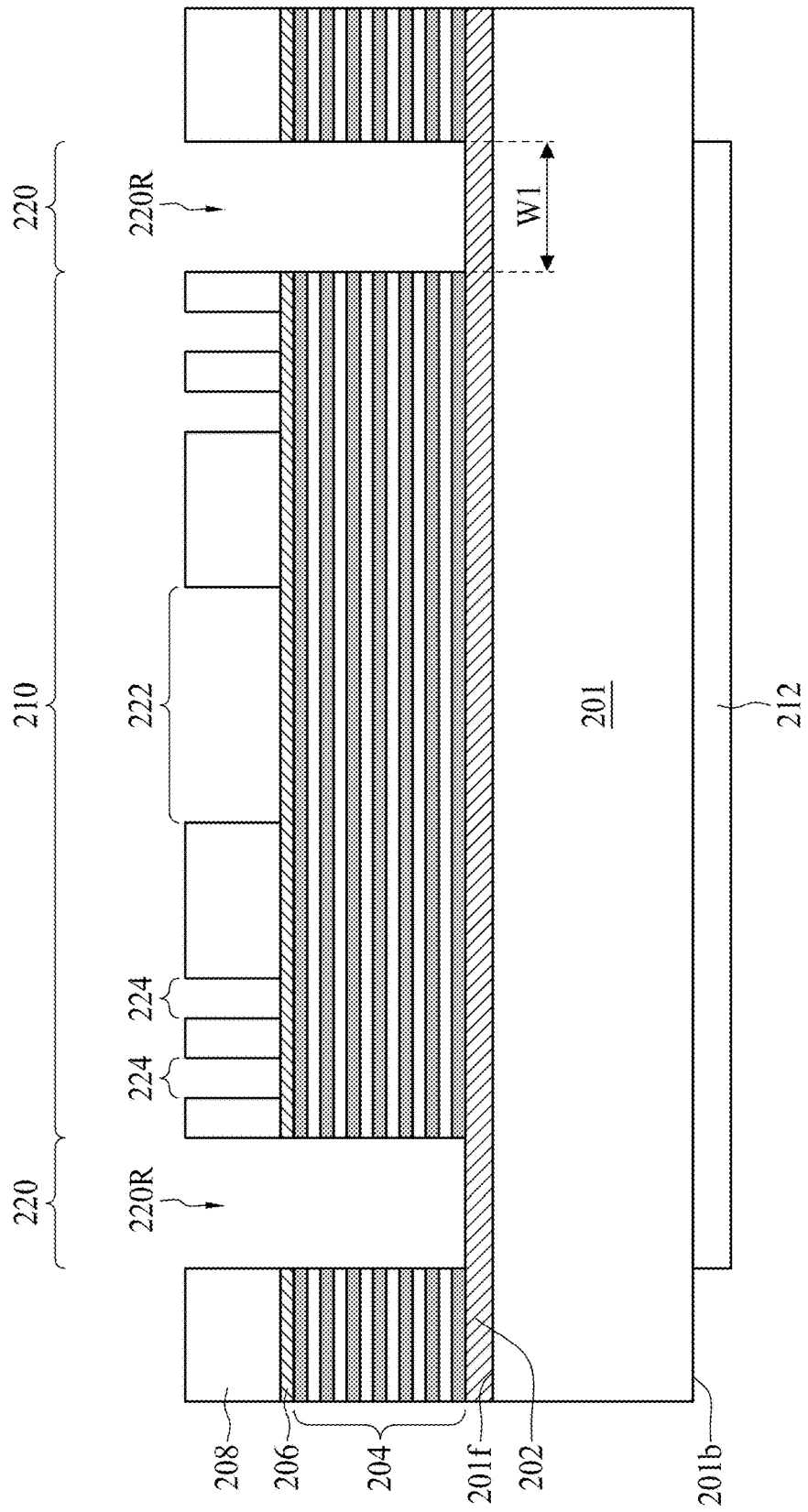
FIG. 2A is a schematic cross-sectional view of a photomask, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 70 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" and "substantially" generally mean within 10%, 5%, 1% or 0.5% of a given value or range. Alternatively, the terms "about," "substantial" and "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

An extreme ultraviolet (EUV) photomask is typically a reflective mask that includes circuit patterns and transfers the patterned EUV radiation onto the wafer through reflection of incident EUV radiation during a photolithography operation. The layout of the EUV photomask includes an imaging region in which the circuit pattern is disposed. The photomask at least includes a light-absorption layer over a light-reflective layer, in which the light-absorption layer is patterned to form the circuit pattern thereon. The photomask generally includes a capping layer between the light-absorption layer and the light-reflective layer. The patterned EUV light is reflected from the light-reflective layer, through the capping layer and the patterned light-absorption layer, and radiated onto the wafer. The lithography performance of the EUV photomask is sensitive to contamination since the contamination particles may adhere to the surface of the capping layer or the light-reflective layer and form an additional material layer on the capping layer or the light-reflective layer. The light propagation paths of EUV light may be altered due to the added material layer, and the fidelity of the circuit pattern, e.g., the boundary sharpness, is likely to be adversely affected.

The present disclosure provides a photomask and a method of manufacturing the photomask. In the proposed photomask, a contaminant absorber is formed on one or more layers of the photomask and serves to reduce or eliminate the effect of the accumulation of contamination on the light-reflective layer or the capping layer, e.g., under an ultra-high vacuum (UHV) environment. A first type contaminant absorber is provided in the border region of the photomask with contaminant-absorbing materials to increase the area of contamination absorption. A second type contaminant absorber is formed in the capping layer, in which absorber features are formed in the light-absorption layer to expose part of the capping layer for absorbing contaminants. The first type and second type contaminant absorbers can be utilized alone or in combination. With the above-mentioned contaminant absorbers, the effective thickness of the material over the capping layer or the light-reflective layer due to accumulated contaminant is reduced, and idle time and cost for cleaning the photomask are decreased accordingly. As a result, the service life and operation cycle of the photomask are improved.

FIG. 1 is a block diagram of a lithography system 100, in accordance with some embodiments. The lithography system 100 is an EUV lithography system in the depicted example, but may be other types of lithography system, such as a deep ultraviolet (DUV) lithography system or a transmissive-type lithography system. The lithography system 100 includes an illumination source 102, an illumination optics module 104, a photomask module 106, a projection optics module 108 and a wafer stage 110. It should be understood that other modules may be incorporated to the lithography system 100, although they are not shown in FIG. 1 for simplicity.

The illumination source 102 is operable to generate radiation beams having a wavelength suitable for lithography, for example, a wavelength smaller than about 50 nanometers (nm), and even as small as about 10 to 15 nm in some cases. Specifically, the wavelength of the radiation beams may be set at about 13.5 nm for EUV lithography systems. In some embodiments, the illumination source 102 generates the radiation beams in a laser-produced plasma (LPP) or a discharge-produced plasma (DPP) system, in which a high-power laser is used to generate a high-energy plasma to thereby form the radiation beams. In some embodiments, the illumination source 102 includes a vacuum chamber to generate the radiation beams. As a result, the lithography system 100 can achieve enhanced resolution of the circuit pattern due to the small wavelength of the radiation beams.

The illumination optics module 104 is formed of one or more optical components to collect, guide or shape the incoming light from the illumination source 102 to the photomask module 106. For example, the illumination optics module 104 may include a collector to collect the radiation beams produced by the illumination source 102. The illumination optics module 104 may also include a plurality of mirrors to reflect the radiation. The materials of the mirrors are selected to minimize radiation absorption of the radiation beams. In some embodiments, the mirrors may include a stack of alternating molybdenum (Mo) and silicon (Si) layers to reduce absorption of the radiation beams. In some cases, an additional anti-absorption coating may also be utilized to further reduce radiation absorption. In some embodiments, the illumination optics module 104 is enclosed in a vacuum chamber to reduce the effect of radiation absorption by ambient gases.

The photomask module 106 includes a photomask stage configured to hold a photomask, in which the photomask transfers the circuit pattern thereon to a target, such as a wafer on the wafer stage 110, through patterning the incident radiation beams from the illumination optics module 104. In some embodiments, the photomask includes a multi-layered structure. The photomask is a reflective-type photomask, such as a phase shift mask, in the present embodiment but may also be a transmissive-type photomask in other embodiments. The phase shift mask may be an attenuated phase shift mask (AttPSM) or an alternating phase shift mask (AltPSM). The structure of the photomask is described in greater detail in subsequent paragraphs.

The radiation beams are directed to the photomask in the photomask module 106 from the illumination optics module 104, and then emitted to the projection optics module 108. The projection optics module 108 may include one or more reflective mirrors, lenses, condensers, etc. In some embodiments, the projection optics module 108 may include ring field optics components. In some embodiments, the projection optics module 108 includes an aperture (or a slit) that is shaped like an arc to allow the patterned radiation beams to pass to the wafer on the wafer stage 110. In various embodiments, the photomask module 106 is disposed over the projection optics module 108.

The wafer stage 110 is configured to hold a wafer that is to be patterned. In some embodiments, the wafer stage 110 includes an electronic chuck (E-chuck) to secure the wafer using electronic force. In other embodiments, the wafer stage 110 includes clamps to mechanically secure the wafer. The wafer stage 110 may include positioning devices to move the wafer during the lithography operation such that various regions of the wafer can be stepped and scanned in succession. In some embodiments, the wafer stage 110 is positioned beneath the projection optics module 108.

FIG. 2A is a schematic cross-sectional view of a photomask 200, in accordance with some embodiments. The photomask 200 may be used as the photomask in the photomask module 106 illustrated in FIG. 1 for performing EUV lithography operations, i.e., it is compatible with a radiation source having a wavelength between about 1 nm and 100 nm, e.g., 13.5 nm. However, the photomask 200 can also be suitable for deep UV (DUV) or other suitable wavelengths. In an embodiment in which the photomask 200 is constructed as a reflective mask, a patterning radiation for a wafer is formed through reflection of incident radiation via the photomask 200. Referring to FIG. 2A, the structure of the photomask 200 includes a substrate 201, a contaminant-absorption layer 202, a multilayer stack 204, a capping layer 206 and a light-absorption layer 208.

The substrate 201 is formed of a low thermal expansion (LTE) material, such as fused silica, fused quartz, silicon, silicon carbide, black diamond and other low thermal expansion substances. In some embodiments, the substrate 201 serves to reduce image distortion resulting from mask heating. In the present embodiment, the substrate 201 includes material properties of a low defect level and a smooth surface. In some embodiments, the substrate 201 transmits light at a predetermined spectrum, such as visible wavelengths, infrared wavelengths near the visible spectrum (near-infrared), and ultraviolet wavelengths. In some embodiments, the substrate 201 absorbs EUV wavelengths and DUV wavelengths.

The photomask 200 is partitioned into an imaging region 210 and a border region 220, in which the border region 220 laterally surrounds and defines the imaging region 210. In some embodiments, the border region 220 includes a trench 220R delimiting the imaging region 210. The border region 220 also serves to prevent excess radiation around the boundary of the imaging region 210 from leaking into adjacent die fields of the wafer. To this end, the reflectivity ratio between the imaging region 210 and the border region 220 should be made as large as possible. In an embodiment, the border region 220 has a reflectivity lower than about 0.1%. In an embodiment, the border region 220 has a reflectivity lower than about 0.05%, e.g., 0.01%.

The contaminant-absorption layer 202 is formed over the substrate 201. In some embodiments, the trench 220R of the border region 220 extends through the light-absorption layer 208, the capping layer 206 and the multilayer stack 204. A portion of the contaminant-absorption layer 202 is exposed through the trench 220R. The exposed portion of the contaminant-absorption layer 202 functions to absorb residual contaminant adhering to the photomask 200. For example, the contaminant-absorption layer 202 reacts with hydrocarbon particles, such as $CO_2$, CO, $C_2H_4$ and $CH_4$, to form a carbon-based layer thereon. The carbon-based layer tends to absorb the impinging radiation beams, especially the high-energy EUV light, and the intensity of the patterning radiation beams is reduced accordingly. The weakened patterning radiation beams may lead to insufficient exposure and generate patterns with less width than expected. In some embodiments, the accumulated thickness of the carbon-based layer on the capping layer 206 with respect to an isolated pattern is greater than the accumulated thickness of the carbon-based layer on the capping layer 206 with respect to a densely-arranged pattern because the densely-arranged pattern spreads the same amount of contaminant over a contact area greater than the contact area of the isolated pattern. With help of the contaminant-absorption layer 202, the hydrocarbon particles that would otherwise be absorbed by the capping layer 206 in the imaging region 210 are trapped by the contaminant-absorption layer 202 through the process of physisorption or chemisorption. Therefore, the adverse effect of the contaminants on the imaging region 210 can be reduced. The contaminant-absorption layer 202 is referred to as the first type contaminant absorber. The contaminant-absorption layer 202 may have a thickness between about 0.05 nm and about 20 nm, between about 0.1 nm and about 10 nm, or between about 0.5 nm and about 5 nm.

In some embodiments, the contaminant-absorption layer 202 is formed of a material having strong catalysis properties to facilitate absorption of the gaseous contaminant. In some embodiments, the material of the contaminant-absorption layer 202 includes ruthenium (Ru), platinum (Pt), rhodium (Rh), palladium (Pd), iridium (Ir), or the like. In other embodiments, the contaminant-absorption layer 202 is formed of oxide of Ru, Ti, Ce, Zr, or Al, e.g., $RuO_2$, $TiO_2$, $CeO_2$, $ZrO_2$, $Al_2O_3$, or the like.

Further, the contaminant-absorption layer 202 has a low reflectivity with respect to EUV radiation in order to prevent the radiation beam from leaking outwardly from the trench 220R. In an embodiment, the contaminant-absorption layer 202 has a reflectivity lower than about 0.1%. In an embodiment, the contaminant-absorption layer 202 has a reflectivity lower than about 0.05%, e.g., 0.01%.

The multilayer stack 204 is formed over a front side 201f of the contaminant-absorption layer 202. The multilayer stack 204 serves as a radiation-reflective layer of the photomask 200. The multilayer stack 204 may include pairs wherein each pair is formed of a molybdenum (Mo) layer and a silicon (Si) layer. The number of alternating Mo layers and Si layers (i.e., the number of Mo/Si pairs) and the thicknesses of the Mo layers and the Si layers are determined so as to facilitate constructive interference of individual reflected rays (i.e., Bragg reflection) and thus increase the reflectivity of the multilayer stack 204. In some embodiments, the reflectivity of the multilayer stack 204 is greater than about 60% for wavelengths of interest e.g., 13.5 nm. In some embodiments, the number of Mo/Si pairs in the multilayer stack 204 is between about 20 and about 80, e.g., 40. Further, in some embodiments, each of the Mo layers or each of the Si layers has a thickness between about 2 nm and about 10 nm, e.g., 7 nm. In some embodiments, the layers of Si and Mo have substantially the same thicknesses. In alternative embodiments, the Si layers and the Mo layers have different thicknesses. The Si and Mo layers may be formed by physical vapor deposition (PVD), chemical vapor deposition (CVD), plasma-enhanced CVD (PECVD), atomic layer deposition (ALD), or any other suitable process.

The capping layer 206 is disposed over the multilayer stack 204. In some embodiments, the capping layer 206 is used to prevent oxidation of the multilayer stack 204 during a mask patterning process. In some embodiments, the capping layer 206 is made of ruthenium (Ru) or ruthenium oxide ($RuO_2$). Other capping layer materials, such as silicon dioxide ($SiO_2$), amorphous carbon or other suitable compositions, can also be used in the capping layer 206. The capping layer 206 may have a thickness between about 1 nm and about 10 nm. In certain embodiments, the thickness of the capping layer 206 is between about 2 nm and about 4 nm. In some embodiments, the capping layer 206 is formed by PVD, CVD, low-temperature CVD (LTCVD), ALD or any other suitable film-forming method.

The light-absorption layer 208 is disposed over the capping layer 206. In some embodiments, the light-absorption layer 208 is an anti-reflective layer that absorbs radiation in the EUV wavelength ranges impinging onto the photomask 200. The light-absorption layer 208 may include chromium, chromium oxide, titanium nitride, tantalum nitride, tantalum oxide, tantalum boron nitride, tantalum, titanium, aluminum-copper, combinations thereof, or the like. The light-absorption layer 208 may be formed of a single layer or of multiple layers. For example, the light-absorption layer 208 includes a chromium layer and a tantalum nitride layer. In some embodiments, the light-absorption layer 208 has a thickness in a range between about 10 nm and about 100 nm, or between 40 nm and about 80 nm, e.g., 70 nm. In some embodiments, the light-absorption layer 208 is formed by PVD, CVD, LTCVD, ALD or any other suitable film-forming method.

In some embodiments, an antireflective layer (not shown) is disposed over the light-absorption layer 208. The antireflective layer may reduce reflection of the impinging radiation having a wavelength shorter than the DUV range from the light-absorption layer 208, and may include a same pattern as the underlying light-absorption layer 208. The antireflective layer may be a TaBO layer having a thickness between about 12 nm and about 18 nm. Other materials, such as $Cr_2O_3$, ITO, SiN and $TaO_5$, may also be used. In other embodiments, a silicon oxide film having a thickness between about 2 nm and about 10 nm is adopted as the antireflective layer. In some embodiments, the antireflective layer is formed by PVD, CVD, LTCVD, ALD, or any other suitable film-forming method.

In some embodiments, the photomask 200 further includes a conductive layer 212 on a backside 201b of the substrate 201. The conductive layer 212 may aid in engaging the photomask 200 with an electric chucking mechanism (not separately shown) in a lithography system. In some embodiments, the conductive layer 212 includes chromium nitride (CrN), chromium oxynitride (CrON), or another suitable conductive material. In some embodiments, the conductive layer 212 includes a thickness in a range from about 50 nm to about 400 nm. The conductive layer 212 may have a surface area less than the surface area of the substrate 201. In some embodiments, the conductive layer 212 has a length or width in a range between 70% and 95% of a length or a width, respectively, of the substrate 201. The conductive layer 212 may be formed by CVD, ALD, molecular beam epitaxy (MBE), PVD, pulsed laser deposition, electron-beam evaporation, ion beam assisted evaporation, or any other suitable film-forming method.

Figure 2B:
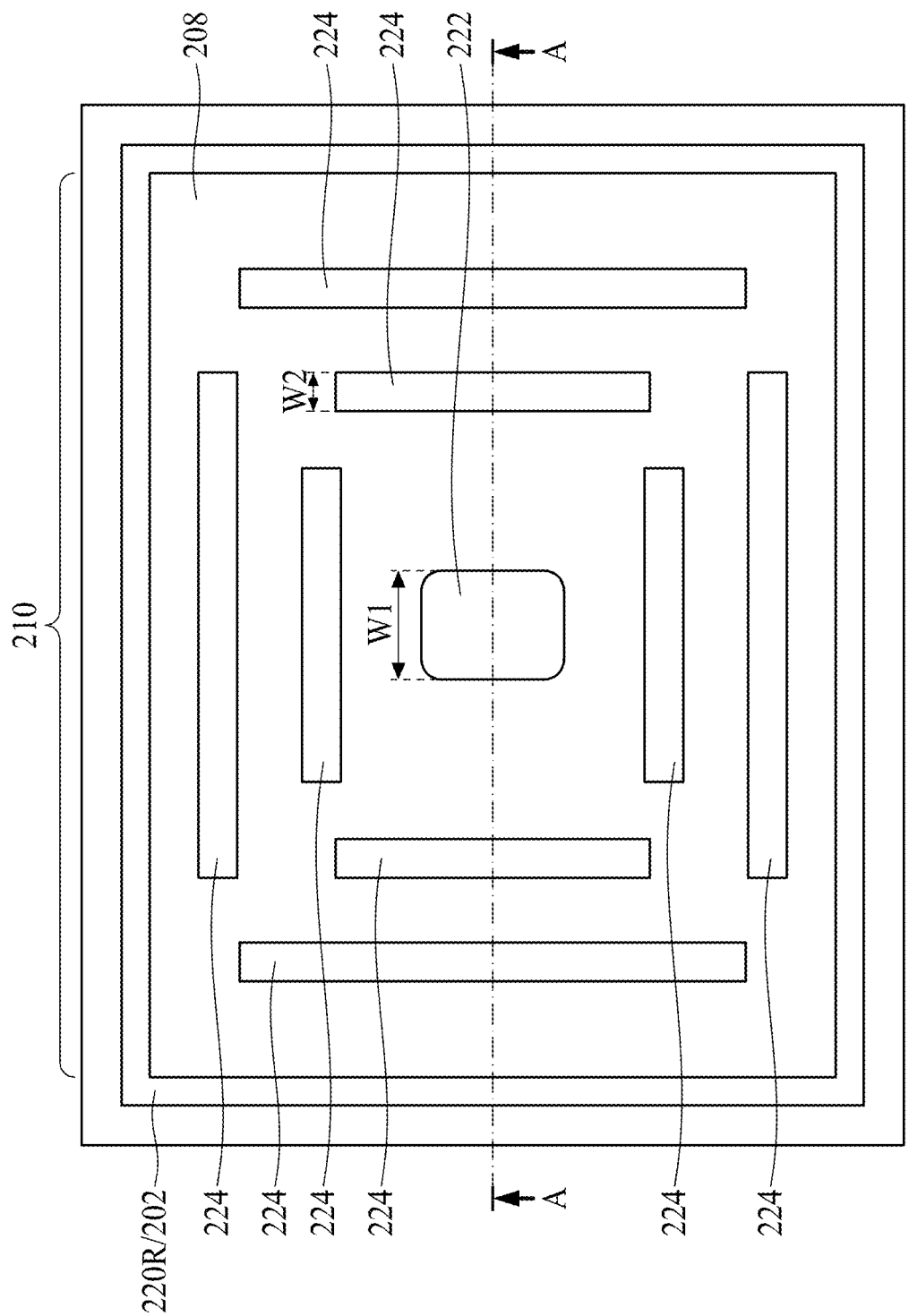
FIGS. 2B and 2C are schematic top views of the photomask shown in FIG. 2A, in accordance with various embodiments.

FIG. 2B is a schematic top view of the photomask 200 shown in FIG. 2A, in accordance with various embodiments. FIG. 2A is a view along sectional lines AA in FIG. 2B. Referring to FIGS. 2A and 2B, the border region 220 may be separated from the edge of the photomask 200 by a gap. Alternatively, in other embodiments, the border region 220 may extend to the edge of the photomask 200. The border region 220 has a rectangular ring shape from a top-view perspective and surrounds the imaging region 210; however, other border region shapes, e.g., an annular ring or other suitable shapes, are also possible.

The light-absorption layer 208 includes circuit patterns to be transferred to the wafer. Some portions of the light-absorption layer 208 cover the capping layer 206 while some other portions of the light-absorption layer 208 expose the capping layer 206. During a lithography operation, part of the radiation beam impinging on the photomask 200 is shielded by the light-absorption layer 208 to form a patterned radiation beam, thus causing a component layer of the wafer to be patterned accordingly. In other words, the radiation beam functions to print the pattern onto the wafer. Throughout the present disclosure, a pattern 222 in the light-absorption layer 208 that is to be transferred to the wafer is referred to as a printable pattern or a printable feature. The minimal width of the printable pattern 222 is determined by the resolution of the lithography system 100 and is generally governed by the numerical aperture (NA) of the optics and the wavelength. The minimal width of the printable pattern 222 may be equal to or greater than the resolution of the lithography system 100. The printable pattern 222 having a width W1 less than the resolution will lead to degraded image quality of the pattern, such as polygons or circles with blurred sides. In some embodiments, the width W1 of the printable pattern 222 is greater than about 6 nm. In some embodiments, the width W1 of the printable pattern 222 is greater than about 4.75 nm.

The light-absorption layer 208 also includes another type of pattern 224 that is configured not to be transferred to the wafer. Instead, the pattern 224 is formed as an opening exposing the underneath capping layer 206 to increase the area of contaminant absorption. In this regard, part of the capping layer 206 also serves as another contaminant-absorption layer in addition to the contaminant-absorption layer 202. The portion or surface of the capping layer 206 having a shape of the pattern 224 and exposed through the opening of the pattern 224 of the light-absorption layer 208 is referred to as the second type contaminant absorber. The contaminant absorption pattern 224 is formed in the light-absorption layer 208 adjacent to or away from the printable pattern 222. This type of pattern is referred to as a non-printable pattern or non-printable feature throughout the present disclosure since it does not contribute to the circuit pattern formed on the wafer. The maximal width of the non-printable pattern 224 is determined by the resolution of the lithography system 100 and is generally governed by the numerical aperture (NA) of the optics and the wavelength. The non-printable pattern 224 with a width greater than the resolution may lead to unexpected transferring of the non-printable pattern 224 on the wafer. In some embodiments, the width of the non-printable pattern 224 is between 1 nm and about 6 nm given the lithography radiation beams at a wavelength of about 13.5 nm, i.e., an EUV light. In some embodiments, the width of the non-printable pattern 224 is between about 1 nm and about 4.75 nm given the lithography radiation beams at a wavelength of about 13.5 nm, i.e., an EUV light. The non-printable pattern 224 having a width less than about 1 nm may not bring forth recognizable performance improvement in contaminant absorption. In some embodiments, the non-printable pattern 224 is in a shape of a strip or slit with a long side and a short side, wherein short side has the second width W2 is less than the length of long side. The maximal value of the second width W2 is less than the resolution, e.g., less than about 6 nm or between about 1 nm and about 6 nm, of the lithography system 100. In some embodiments, if the second width W2 is greater than about 6 nm, the likelihood of erroneously transferring the non-printable pattern 224 is increased. In some embodiments, if the second width W2 is less than about 1 nm, it may not be sufficient to maintain desirable lithography resolution of a nearby and isolated printable pattern or serve the function of contaminant absorption. In some embodiments, the non-printable pattern 224 is in a curved or meander shape in order to increase the absorption area of the non-printable pattern 224 while maintaining its non-printability. The curved or meander shape of the non-printable pattern 224 may have the width W2 between about 1 nm and about 6 nm given the lithography radiation beams at a wavelength of about 13.5 nm, i.e., an EUV light.

In some embodiments, the non-printable pattern 224 is formed in a manner and shape similar to those of a sub-resolution assist feature (SRAF) or a scattering bar that are usually used in lithography systems applying non-EUV radiation beams. The SRAF may assist in formation of the printable pattern 222 having a pattern image with higher contrast achieving a smaller line width. In some embodiments, the printable pattern 222 alone is sufficient to generate a circuit pattern with desirable line width without the assistance of the SRAF under the EUV lithography system. In some embodiments, the non-printable pattern 224 serves the functions of enhancing the image quality of the printable pattern 222 as well as absorbing gaseous contaminant. In some embodiments, the non-printable patterns 224 include separate scattering bars and laterally surround the printable pattern 222. In some embodiments, the non-printable pattern 224 is spaced apart from the printable feature 222 by a distance between 1 nm and about 100 nm, between about 5 nm and 70 nm, or between about 10 nm and about 50 nm.

In some embodiments, the printable pattern 222 and the non-printable pattern 224 have respective areas A1 and A2. The non-printable pattern 224 may have a maximal value of the area A2 less than about 80% of the minimal value of the area A1 of the printable pattern 222. If the maximal value of the area A2 exceeds about 80% of the minimal value of the area A1, it is likely that at least part of the non-printable pattern 224 will be transferred to the wafer and adversely impact the layout of the circuit pattern. In some embodiments, the non-printable pattern 224 may have a maximal value of the area A2 less than about 70% of the minimal value of the area A1 of the printable pattern 222.

Still referring to FIG. 2B, the border region 220 constitutes a closed ring separating the imaging region 210 from the periphery of the photomask 200. The photomask 200 is usually secured to the photomask stage via an electric chuck, and therefore the electric field may lead to the issue of electrostatic discharge (ESD) for the photomask 200. The ESD is frequently found during the lithography operation, especially under a high-power radiation beam such as EUV light, and may cause damage to the photomask 200 if not dealt with appropriately. To this end, the contaminant-absorption layer 202 may be selected to include materials having low resistance to facilitate conduction and distribution of electrostatic discharge (ESD) across the border region 220 and the photomask 200 to reduce the probability of ESD damage. In some embodiments, the contaminant-absorption layer 202 includes a conductive material having a resistivity less than about 12μΩ-cm, e.g., ruthenium (Ru), platinum (Pt), rhodium (Rh), palladium (Pd), iridium (Ir), a combination thereof, or the like.

Figure 2C:
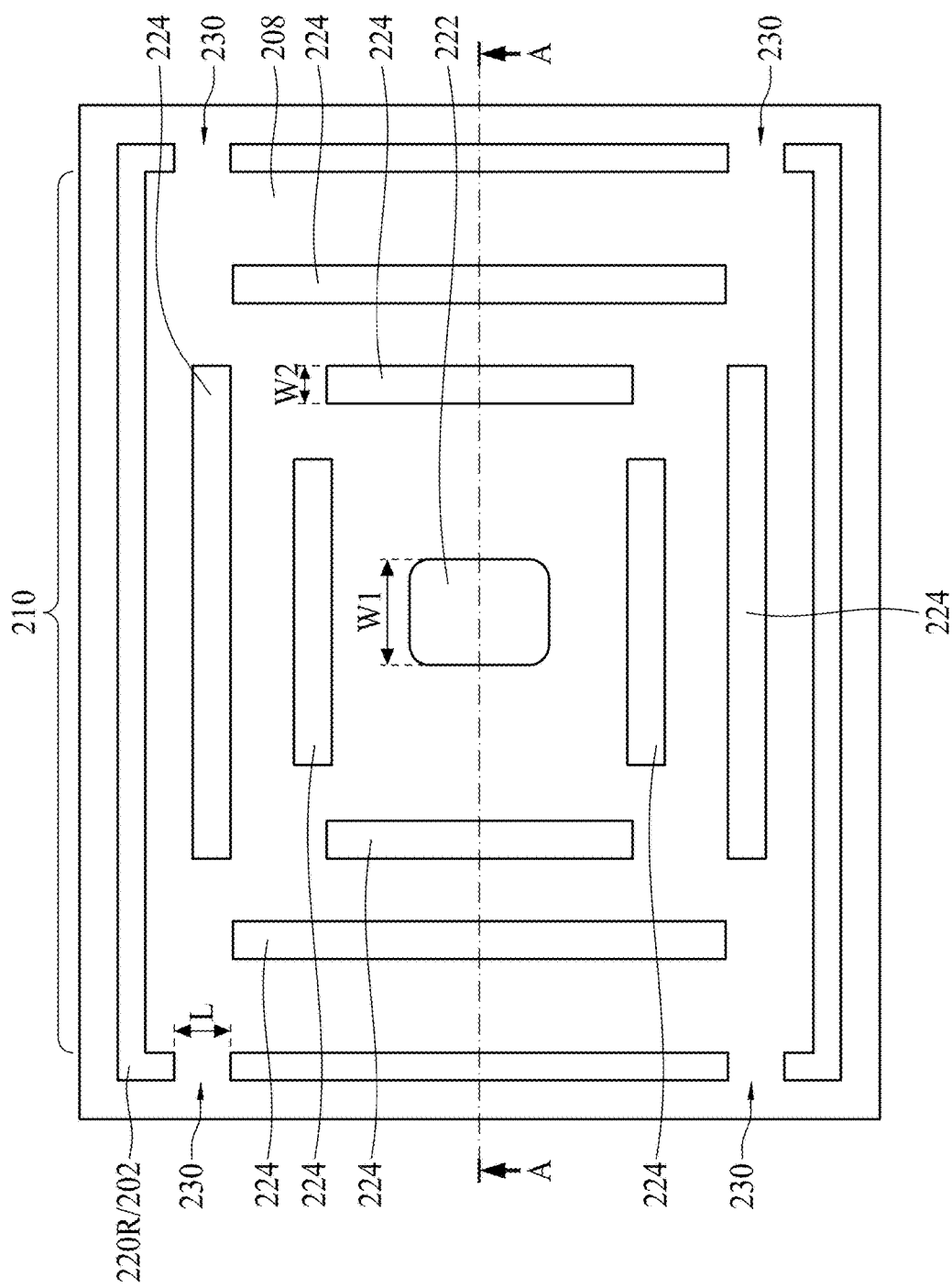

FIG. 2C is a schematic top view of the photomask 240 shown in FIG. 2A, in accordance with another embodiment. The photomask 240 is similar to the photomask 200 shown in FIG. 2B, except for the configuration of the border region 220. The photomask 240 includes bridge portions in the border region 220 for connecting the periphery of the photomask 240 to the imaging region 210. In other words, bridge portions 230 extend across the trench 220R and interrupt the ring shape of the connected trench 220R in FIG. 2B into disconnected trenches 220R. The bridge portions 230 may include at least one of the light-absorption layer 208, the capping layer 206 and the multilayer stack 204 from a cross-sectional view. With help of the bridge portions 230, the imaging region 210 is electrically coupled to the periphery of the photomask 240, thereby facilitating the distribution of and decreasing the damage from ESD. In some embodiments, the bridge portions 230 have a length L between about 1 μm and about 30 μm or between about 5 μm and 20 μm measured along the direction of the side of the photomask 200 parallel to the trench 220R. In such situation, the materials of the contaminant-absorption layer 202 can have medium to high resistivity without adversely affecting the performance of the photomask 240. In some embodiments, the contaminant-absorption layer 202 includes ruthenium (Ru), platinum (Pt), rhodium (Rh), palladium (Pd), iridium (Ir), a combination thereof, or the like. In some other embodiments, the contaminant-absorption layer 202 is formed a material having a resistivity higher than about 30μΩ-cm, e.g., oxide of Ru, Ti, Ce, Zr, or Al (i.e., $RuO_2$, $TiO_2$, $CeO_2$, $ZrO_2$, $Al_2O_3$), a combination thereof, or the like. The contaminant-absorption layer 202 in the configuration of the border region 220 shown in FIG. 2B allows for a greater absorption area, while the contaminant-absorption layer 202 of the configuration of the border region 220 shown in FIG. 2C allows for more choices of materials used for forming the contaminant-absorption layer 202.

Although the two types of contaminant absorbers discussed above are shown to be advantageous in reducing contaminant accumulation on the capping layer of a reflective-type photomask, they are also applicable to other configurations of photomasks and lithography systems. For example, the lithography system using a transmissive-type photomask or the radiation beams with other wavelengths may also be vulnerable to gaseous contaminant during the lithography operation, and a contaminant-absorption layer or feature formed of the material of the contaminant-absorption layer 202 or the capping layer 206 discussed above will effectively absorb the contaminant and enhance the lithography performance.

FIGS. 3A to 3F are cross-sectional views of intermediate stages of a method of manufacturing the photomask 300, in accordance with some embodiments.

The completed photomask 300 may be similar to the photomask 200 in FIG. 2A. It should be understood that additional operations can be provided before, during, and after the processes shown in FIGS. 3A to 3F, and some of the operations described below can be replaced or eliminated, for additional embodiments of the method. The order of the operations/processes may be changed. Materials, configurations, dimensions, processes and/or operations the same as or similar to those described with respect to the foregoing embodiments may be employed in the following embodiments and the detailed explanation thereof may be omitted.

Figures 3A, 3B:
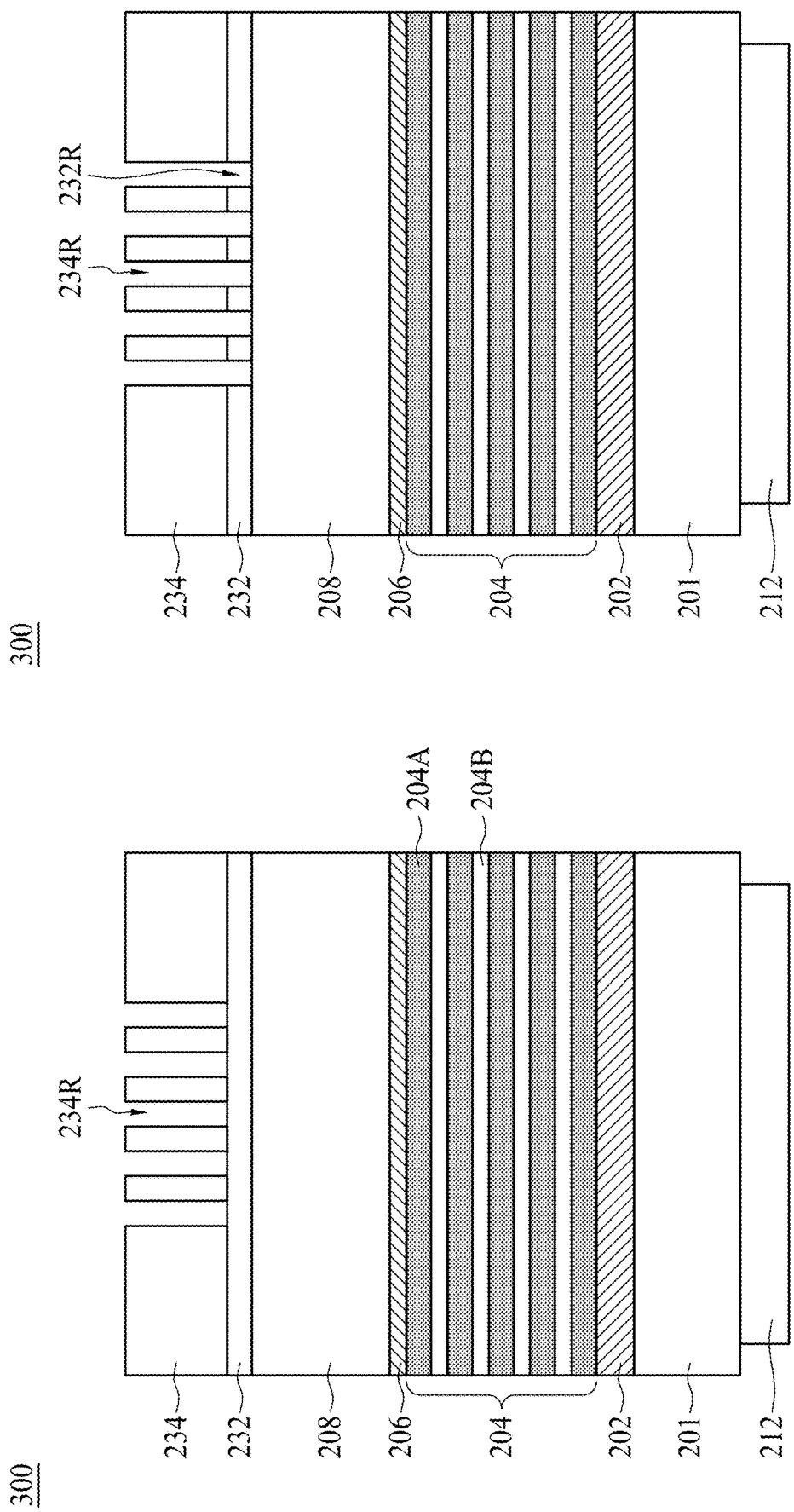

Referring to FIG. 3A, a stack of multiple layers including the conductive layer 212, the substrate 201, the contaminant-absorption layer 202, the multilayer stack 204, the capping layer 206 and the light-absorption layer 208 is provided. In some embodiments, the substrate 201 is initially provided or formed. The contaminant-absorption layer 202 is deposited over the substrate 201.

The multilayer stack 204 is deposited over the contaminant-absorption layer 202 by alternatingly forming a single Mo layer 204A and a single Si layer 204B, or vice versa, over one another until the predetermined number of Mo/Si layer pairs is reached. In an embodiment, the multilayer stack 204 includes a silicon layer as a bottom layer contacting the substrate 201. Subsequently, the capping layer 206 is deposited over the as-formed multilayer stack 204. The light-absorption layer 208 is deposited over the capping layer 206. Each of the aforementioned layers can be formed in a blanket manner over one another.

In some embodiments, an antireflective layer is formed over the light-absorption layer 208. The conductive layer 212 may be formed on a backside of the substrate 201. In an embodiment, an etching operation is performed to remove a peripheral portion of the conductive layer 212 so that an indentation of the conductive layer 212 with respect to the substrate 201 is formed.

In some embodiments, a mask layer 232 is disposed over the light-absorption layer 208. In embodiments where the antireflective layer is present over the light-absorption layer 208, the mask layer 232 is formed over the antireflective layer. In some embodiments, the mask layer 232 is a hard mask layer and may be made of silicon, a silicon-based compound, chromium, a chromium-based compound, a combination thereof, or the like. In some embodiments, the chromium-based compound includes chromium oxide, chromium nitride, chromium oxynitride, or the like. In other embodiments, TaO, TaN, Ru, RuB, TaB, TaBN or TaBO is used as the mask layer 232. In some embodiments, the mask layer 232 has a thickness between about 4 nm and about 20 nm.

The forming method of the aforementioned layers may include CVD, ALD, PVD, sputtering, thermal oxidation, atmosphere pressure CVD (APCVD), low-pressure CVD (LPCVD), low-temperature CVD (LTCVD), laser-enhanced CVD (LECVD), plasma-enhanced CVD (PECVD), thermal evaporation, pulsed laser evaporation, electron beam evaporation, molecule beam epitaxy, ion beam-assisted evaporation, or the like.

A photoresist layer 234 is deposited over the mask layer 232. The photoresist layer 234 may be formed of a photosensitive material or other suitable resist materials. The photoresist layer 234 may be deposited over the mask layer 232 by CVD, ALD, PVD, spin coating, or other suitable film-forming method. Once formed, the photoresist layer 234 is patterned according to a predetermined circuit pattern. Patterning of the photoresist layer 234 may include a maskless exposure such as electron-beam writing, ion-beam writing, developing the photoresist layer 234 and etching unwanted portions of the photoresist layer 204. Openings 234R are formed through the patterning operations.

FIG. 3B shows the patterning of the mask layer 232 according to the patterned photoresist layer 234. Patterning operations of the mask layer 232 may include performing photolithography and etching steps on the mask layer 232 to form openings 232R with the patterned photoresist layer 234 as an etching mask. The openings 232R are formed as downward extensions of the openings 234R that run through the mask layer 232 and expose the light-absorption layer 208. An exemplary patterning process includes photomask aligning, exposing and developing the mask layer 232, and etching of the mask layer 232. Next, the photoresist layer 234 is removed as illustrated in FIG. 3C. The removal operations may include an etching or ashing operation.

Figure 3D:
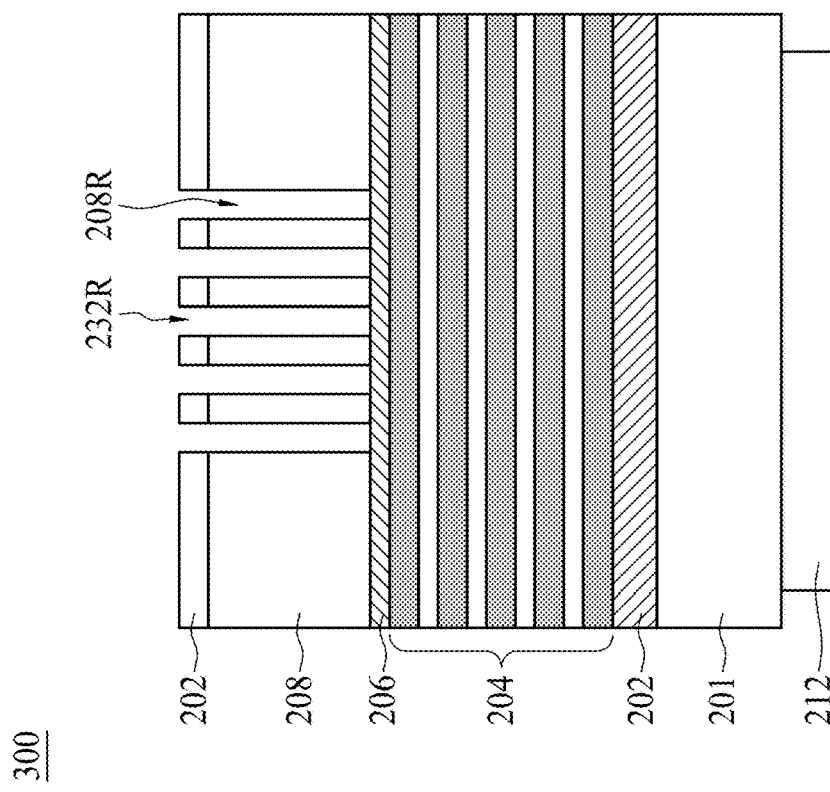
Figure 3C:
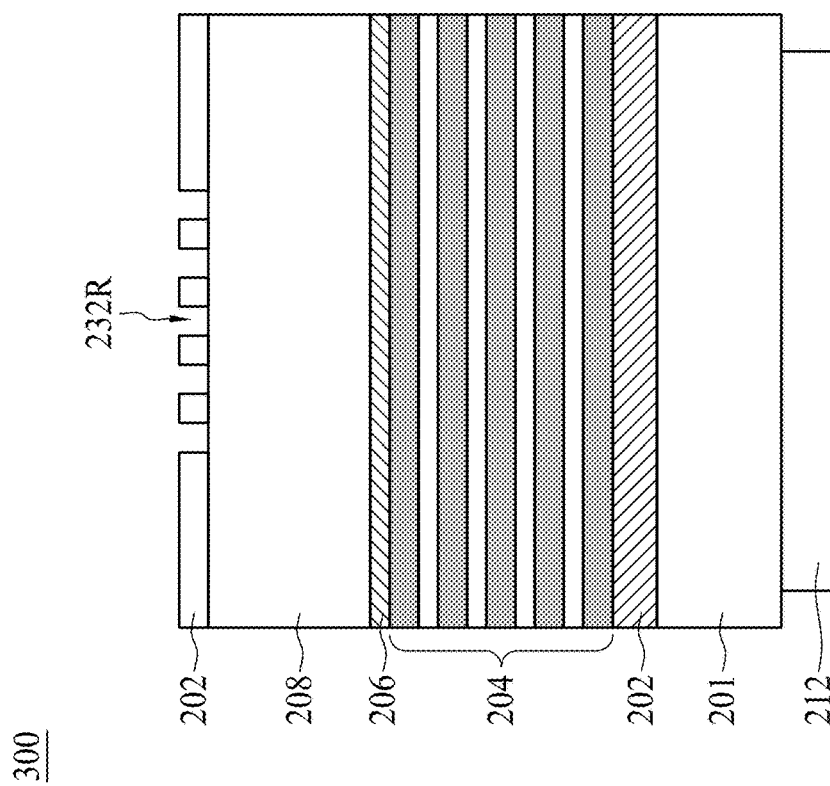

In FIG. 3D, the light-absorption layer 208 is patterned according to the patterned mask layer 232. Patterning operations of the light-absorption layer 208 may include performing photolithography and etching steps on the light-absorption layer 208 to form openings 208R with the mask layer 232 as etching mask. The openings 208R are formed as downward extensions of the openings 232R that extend through the light-absorption layer 208 and expose the capping layer 206. An exemplary patterning process includes photomask aligning, exposing and developing the light-absorption layer 208, and etching of the light-absorption layer 208. In some embodiments, the patterning of the light-absorption layer 208 forms printable patterns and non-printable patterns during a same patterning operation using a same mask layer 232 as an etching mask. In some embodiments, the mask layer 232 is removed after the light-absorption layer 208 has been patterned. The removal operations may include an etching or ashing operation. The patterns in the light-absorption layer 208, i.e., openings 208R, are formed within the imaging region, e.g., the imaging region 210 shown in FIG. 1.

FIGS. 3E to 3F illustrate the forming of border regions 220. Initially, a photoresist layer 236 is deposited over the patterned light-absorption layer 208 as shown in FIG. 3E. The photoresist layer 236 may be formed of a photosensitive material or other suitable resist materials. The photoresist layer 236 may include a material the same as or different from that of the photoresist layer 234. The photoresist layer 236 may be deposited over the light-absorption layer 208 by CVD, ALD, PVD, spin coating, or other suitable film-forming method. The photoresist layer 236 may fill the openings 208R. Once formed, the photoresist layer 236 is patterned where the border regions 220 are situated. Patterning of the photoresist layer 236 may include a mask-based or mask-less exposure, developing the photoresist layer 236 and etching unwanted portions of the photoresist layer 236. Openings 236R are formed through the patterning operations.

An etching operation is performed to form the trenches 220R of the border region 220 according to the openings 236R. The etching operation may include a dry etch, a wet etch, a combination thereof, or the like. Through the etching operations, the trenches 236R extend through the light-absorption layer 208, the capping layer 206, and the multilayer stack 204, and expose an upper surface of the contaminant-absorption layer 202. In some embodiments, the bridge portions 230 are left in the border region 220 for connecting the imaging region 210 to the periphery of the photomask 200. In some embodiments, one or more layers of the border region 220 at the bridge portion 230 are removed, e.g., in a certain bridge portion 230 the light-absorption layer 208 is removed while the capping layer and the multilayer stack 204 are left. Through the patterning of the bridge portions, a plurality of separate trenches 236R are formed accordingly.

Referring to FIG. 3F, after the trenches 236R are formed, the photoresist layer 236 is removed, and the trench(es) 220R is left in place. The removal operation may include an etching or ashing operation. The photomask 200 is thus completed. In some embodiments, the order of steps for the patterning of the light-absorption layer 208 in FIGS. 3A to 3D and the steps for forming the border regions 220 in FIGS. 3E to 3F may be changed.

Figure 4:
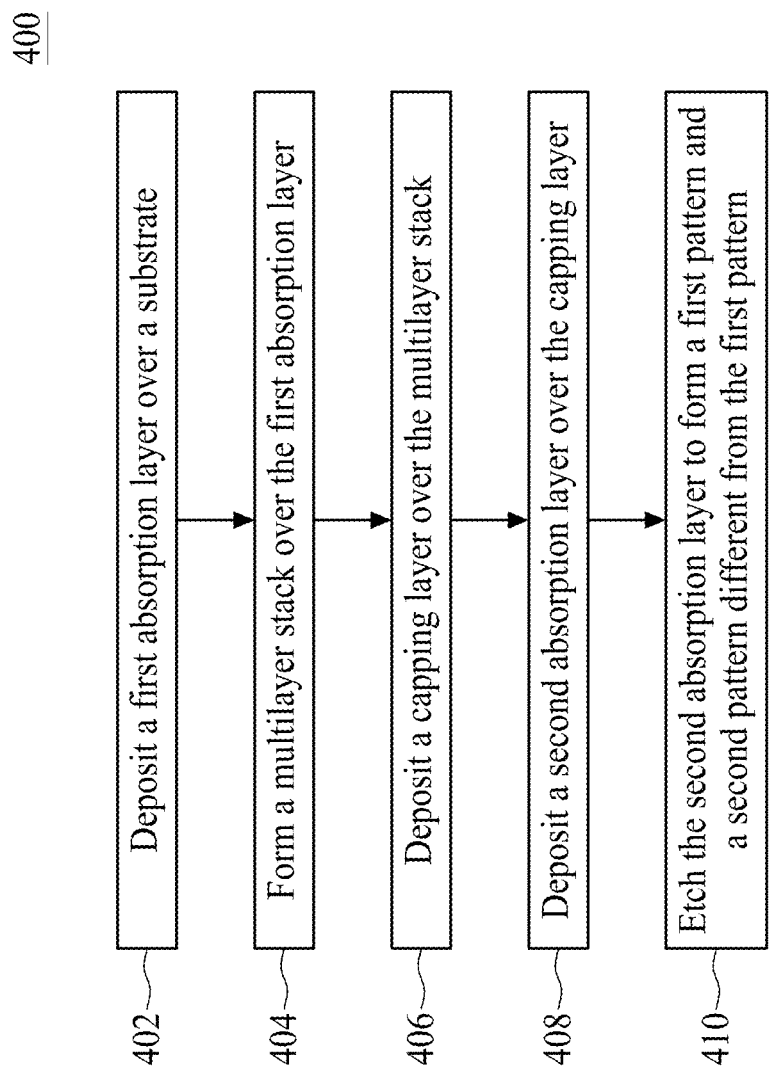
FIG. 4 is a flowchart of a method of manufacturing a photomask, in accordance with some embodiments.

FIG. 4 is a flowchart of a method 400 of manufacturing a photomask, in accordance with some embodiments. At step 402, a first absorption layer is deposited over a substrate. In some embodiments, the first absorption layer is a contaminant-absorption layer. At step 404, a multilayer stack is formed over the first absorption layer. In some embodiments, the multilayer stack is configured to reflect a radiation beam, e.g., at a wavelength of about 13.5 nm.

At step 406, a capping layer is deposited over the multilayer stack. In some embodiments, the capping layer serves as another contaminant-absorption layer. At step 408, a second absorption layer is deposited over the capping layer. In some embodiments, the second absorption layer serves as a radiation-absorption layer.

At step 410, the second absorption layer is etched to form a first pattern and a second pattern different from the first pattern, in which the first pattern is configured to be transferred to a workpiece during a photolithography operation and the second pattern is configured as a non-printable feature for the workpiece.

Figure 5:
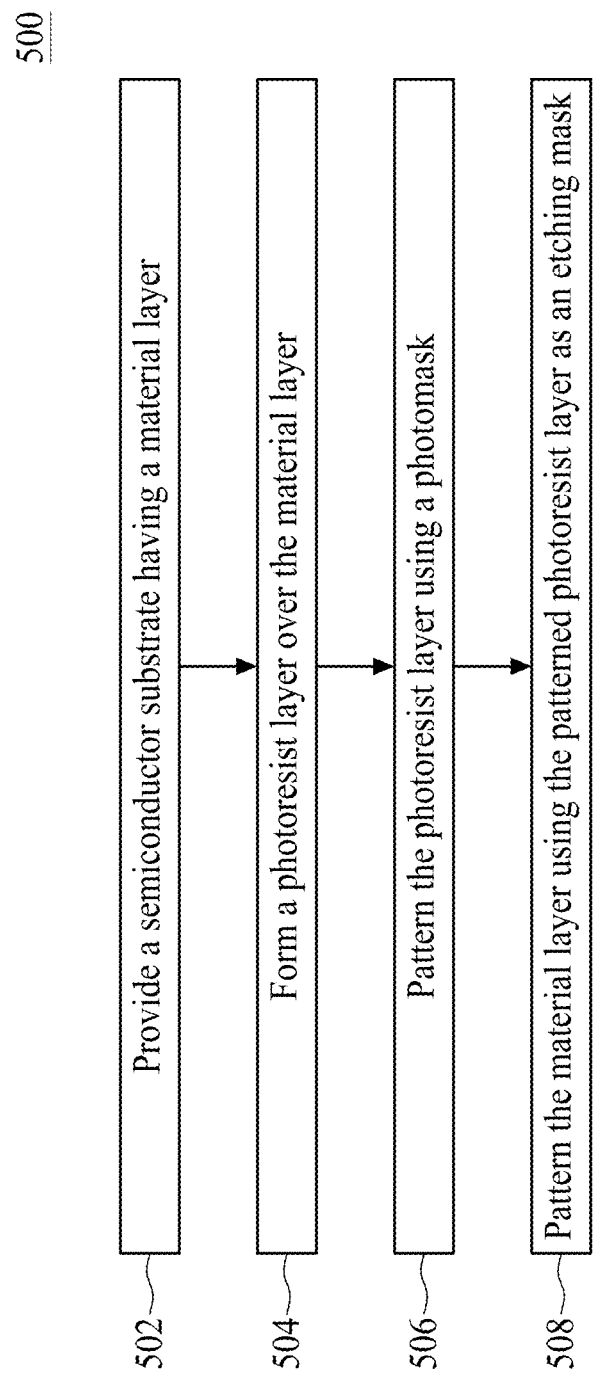
FIG. 5 is a flowchart of a method of manufacturing a semiconductor device, in accordance with some embodiments.

FIG. 5 is a flowchart 500 of a method of manufacturing a semiconductor device, in accordance with some embodiments. The semiconductor device may be manufactured using an EUV mask, such as the photomasks 200 described in relation to FIGS. 2A to 2C and 3A to 3F. The method 500 begins at step 502, wherein a semiconductor substrate having a material layer is provided. The semiconductor substrate includes a semiconductor material such as silicon. In some embodiments, the semiconductor substrate may include other semiconductor materials, such as silicon germanium, silicon carbide, gallium arsenide, or the like. In some embodiments, the semiconductor substrate is a p-type semiconductive substrate (acceptor type) or n-type semiconductive substrate (donor type). Alternatively, the semiconductor substrate includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate is a semiconductor-on-insulator (SOI) substrate. In other alternatives, the semiconductor substrate may include a doped epitaxial layer, a gradient semiconductor layer, and/or a semiconductor layer overlaying another semiconductor layer of a different type, such as a silicon layer on a silicon germanium layer.

In some embodiments, the material layer may be a semiconductor layer, a dielectric layer or a conductive layer. In some embodiments, the material layer may be embedded in the semiconductor substrate or deposited over the semiconductor substrate. The material layer may be formed of a single layer or may include a multilayer structure.

At step 504, a photoresist layer is formed over the material layer. The photoresist layer may be formed over the material layer by CVD, PVD, ALD, spin coating, or other suitable film-forming method. Next, the method 500 continues with step 506, in which the photoresist layer is patterned using a photomask, such as the EUV photomask 200 as described above, in a lithography operation. In an embodiment, the photomask 200 may be disposed on a photomask stage of a lithography system and the semiconductor substrate is disposed on a wafer stage. The lithography operation may involve projection of a patterned exposure radiation onto the photoresist layer through transmission or reflection of the photomask 200. Portions of the photoresist layer may be removed after the lithography operation.

The method 500 continues with step 508 to pattern the material layer using the patterned photoresist layer as an etch mask. Next, the photoresist layer is removed. The removal operations may include an etching or ashing operation.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

According to an embodiment, a photomask includes a substrate, a multilayer stack disposed over the substrate and configured to reflect a radiation, a capping layer over the multilayer stack, and an anti-reflective layer over the capping layer. The anti-reflective layer comprises a first pattern, wherein the first pattern exposes the capping layer and is configured as a printable feature. The photomask also includes an absorber apart from the printable feature from a top-view perspective.

According to an embodiment, a photomask includes a substrate, a first absorption layer over the substrate, a multilayer stack disposed over the first absorption layer and comprising alternating molybdenum layers and silicon layers, a capping layer over the multilayer stack, a second absorption layer over the capping layer, and a trench extending through the first absorption layer, the capping layer and the multilayer stack and exposing a portion of the second absorption layer.

According to an embodiment, a method of forming a photomask includes: depositing a first absorption layer over a substrate; forming a multilayer stack over the first absorption layer, wherein the multilayer stack is configured to reflect a radiation beam; depositing a capping layer over the multilayer stack; depositing a second absorption layer over the capping layer; and etching the second absorption layer to form a first pattern and a second pattern, wherein the first pattern is to be transferred to a workpiece during a photolithography operation, and wherein the second pattern is configured as a non-printable feature for the workpiece.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photomask, comprising:
    a substrate;
    a multilayer stack disposed over the substrate and configured to reflect a radiation;
    a capping layer over the multilayer stack and configured to absorb contaminants;
    a light-absorption layer over the capping layer, the light-absorption layer defining a first pattern and a second pattern, wherein the first pattern exposes the capping layer and is configured as a printable feature, wherein the second pattern exposes the capping layer and configured as a non-printable feature; and
    a contaminant absorber, arranged between the substrate and the multilayer stack, exposed by a trench formed in the multilayer stack and apart from the printable feature from a top-view perspective, wherein the contaminant absorber is a single layer consisting of palladium or iridium
    wherein the second pattern is used for absorbing the contaminants without enhancing printing performance of the first pattern.

2. The photomask according to claim 1, wherein the multilayer stack comprises pairs of layers, wherein each pair is formed of a molybdenum (Mo) layer and a silicon (Si) layer.

3. The photomask according to claim 2, wherein the second pattern comprises a width between about 1 nm and about 6 nm.

4. The photomask according to claim 1, wherein the radiation has a wavelength of 13.5 nm.

5. The photomask according to claim 1, wherein the first pattern comprises a first area, and the second pattern is apart from the first pattern and comprises a second area less than about 80% of the first area.

6. The photomask according to claim 1, further comprising a conductive layer on a side of the substrate opposite to the multilayer stack.

7. The photomask according to claim 1, wherein the capping layer comprises Ru or $RuO_2$.

8. The photomask according to claim 1, wherein the trench extends through the light-absorption layer, the capping layer and the multilayer stack.

9. The photomask according to claim 1, wherein the contaminant absorber comprises a resistivity of less than about 12 μΩ-cm.

10. The photomask according to claim 1, wherein the trench forms a closed ring defining an imaging region of the photomask.

11. The photomask according to claim 1, wherein the contaminant absorber comprises a thickness between about 0.05 nm and about 20 nm.

12. The photomask according to claim 1, wherein the trench is between an imaging region and a periphery of the photomask, further comprising a bridge portion across the trench and connecting the imaging region to the periphery.

13. A photomask, comprising:
a substrate;
a first absorption layer over the substrate and configured to absorb contaminants, wherein the first absorption layer is a single layer consisting of palladium or iridium;
a multilayer stack disposed over the first absorption layer and comprising alternating molybdenum layers and silicon layers;
a capping layer over the multilayer stack;
a second absorption layer over the capping layer the second absorption layer defining a first pattern and a second pattern, wherein the first pattern exposes the capping layer and is configured as a printable feature, wherein the second pattern exposes the capping layer and configured as a non-printable feature; and
a trench extending through the first absorption layer, the capping layer and the multilayer stack and exposing a portion of the second absorption layer
wherein the second pattern is used for absorbing the contaminants without enhancing printing performance of the first pattern.

14. The photomask according to claim 13, wherein the second pattern has a width less than about 6 nm.

15. The photomask according to claim 14, wherein the trench is in a ring shape separating an imaging region from a border region.

16. The photomask according to claim 15, wherein the first absorption layer comprises a thickness between about 0.05 nm and about 20 nm.

17. The photomask according to claim 13, wherein the first absorption layer comprises a reflectivity of less than about 0.1% with respect to a lithography radiation beam associated with the photomask.

18. A method of forming a photomask, the method comprising:
depositing a first absorption layer over a substrate the first absorption layer configured to absorb hydrocarbon-based particles, wherein the first absorption layer is a single layer consisting of palladium or iridium;
forming a multilayer stack over the first absorption layer, the multilayer stack being configured to reflect a radiation beam;
depositing a capping layer over the multilayer stack, the capping layer configured to absorb contaminants;
depositing a second absorption layer over the capping layer; and
etching the second absorption layer to form a first pattern and a second pattern, wherein the first pattern is to be transferred to a workpiece during a photolithography operation, and wherein the second pattern is configured as a non-printable feature for the workpiece
wherein the second pattern is used for absorbing the contaminants without enhancing printing performance of the first pattern.

19. The method according to claim 18, further comprising etching a trench extending through the first absorption layer, the capping layer and the multilayer stack and exposing the second absorption layer.

20. The method according to claim 18, wherein the second pattern comprises an area less than about 80% of an area of the first pattern.

* * * * *